(12) United States Patent
Hsieh et al.

(10) Patent No.: US 9,699,911 B2
(45) Date of Patent: Jul. 4, 2017

(54) PROCESS APPARATUS CAPABLE OF PUSHING PANEL-SHAPED OBJECT AND PROCESS METHOD THEREOF

(71) Applicant: Wistron Corporation, New Taipei (TW)

(72) Inventors: Hao-Chun Hsieh, New Taipei (TW); Chang-Lung Chen, New Taipei (TW); Sheng-Wen Cheng, New Taipei (TW); Pi-Chiang Huang, New Taipei (TW)

(73) Assignee: Wistron Corporation, New Taipei (TW)

( * ) Notice: Subject to any disclaimer, the term of this patent is extended or adjusted under 35 U.S.C. 154(b) by 208 days.

(21) Appl. No.: 14/477,830

(22) Filed: Sep. 4, 2014

(65) Prior Publication Data

US 2015/0334888 A1  Nov. 19, 2015

(30) Foreign Application Priority Data

May 16, 2014  (TW) .............................. 103117357 A

(51) Int. Cl.
*H05K 3/00* (2006.01)
*H05K 13/00* (2006.01)
(Continued)

(52) U.S. Cl.
CPC ............. *H05K 3/007* (2013.01); *B66F 19/00* (2013.01); *H05K 1/0271* (2013.01);
(Continued)

(58) Field of Classification Search
CPC . H05K 13/0061; H05K 13/0069; H05K 3/007
See application file for complete search history.

(56) References Cited

U.S. PATENT DOCUMENTS

| 4,538,909 A | 9/1985 | Bible et al. |
| 6,711,796 B2 * | 3/2004 | Su ...................... H05K 13/0061 269/289 R |
| 2003/0221312 A1 * | 12/2003 | Lee .................... H05K 13/0061 29/762 |

FOREIGN PATENT DOCUMENTS

| CN | 102056447 | 5/2011 |
| TW | 524164 | 3/2003 |

(Continued)

OTHER PUBLICATIONS

"Office Action of China Counterpart Application" with English translation thereof, issued on Sep. 1, 2016, p. 1-p. 17, in which the listed reference was cited.

(Continued)

*Primary Examiner* — Jonathan Snelting
(74) *Attorney, Agent, or Firm* — Jianq Chyun IP Office

(57) ABSTRACT

A process apparatus capable of pushing a panel-shaped object includes a process apparatus and at least one panel-shaped object. The process apparatus includes a carrying fixture and a separating fixture. The carrying fixture has a top surface and a bottom surface opposite to each other and has at least one positioning pillar. The separating fixture has a pushing portion. The panel-shaped object has at least one positioning hole and is carried on the top surface. The positioning pillar is inserted into the positioning hole to position the panel-shaped object. The pushing portion is adapted to move from the bottom surface toward the top surface and protrude out of the top surface, such that the panel-shaped object is pushed up by the pushing portion to be separated from the carrying fixture. In addition, a process method adapted to the process apparatus capable of pushing a panel-shaped object is also provided.

15 Claims, 12 Drawing Sheets

(51) Int. Cl.
*B66F 19/00* (2006.01)
*H05K 1/02* (2006.01)
(52) U.S. Cl.
CPC . *H05K 13/0061* (2013.01); *H05K 2201/2027* (2013.01); *H05K 2203/1509* (2013.01)

(56) References Cited

FOREIGN PATENT DOCUMENTS

| | | |
|---|---|---|
| TW | 200642543 | 12/2006 |
| TW | M433393 | 7/2012 |
| TW | M465389 | 11/2013 |

OTHER PUBLICATIONS

"Office Action of Taiwan Counterpart Application" with partial English translation, issued on Mar. 16, 2015, p. 1-p. 14, in which the listed references were cited.

* cited by examiner

PROCESS APPARATUS CAPABLE OF PUSHING PANEL-SHAPED OBJECT AND PROCESS METHOD THEREOF

CROSS-REFERENCE TO RELATED APPLICATION

This application claims the priority benefit of Taiwan application serial no. 103117357, filed on May 16, 2014. The entirety of the above-mentioned patent application is hereby incorporated by reference herein and made a part of this specification.

BACKGROUND OF THE INVENTION

1. Field of the Invention

The disclosure relates to a process apparatus and a process method thereof, and particularly relates to a process apparatus capable of pushing a panel-shaped object and a process method thereof.

2. Description of Related Art

Through the recent development and improvement in the semiconductor and electronic industries, portable electronic devices such as smart phones, digital cameras, and tablet PCs, etc., are now used more and more commonly. In addition, these products are designed to become more convenient, multi-functional, and exquisite. As the users' demands toward digital products increase, displays, which play an important role in the digital products, also draw the designer's attention. Specifically, the liquid crystal displays (LCD) have now become the mainstream of the displays.

However, the LCD is not self-luminescent. Therefore, a backlight module must be disposed under the LCD as a light source for the display purpose. Currently, most of the backlight modules use light bars formed of light-emitting diodes (LED) as the light source. Moreover, the light bars are disposed beside the light guide plate (LGP). The light-emitting diodes may be reflow soldered on a circuit board to form the LED light bar by using the surface mount technology (SMT). To meet the trend of designing the portable electronic products to be lighter and thinner, it is common to choose circuit boards having a thin thickness as the LED light bars. However, during the process of finishing the reflow soldering of the LED light bars and pick uping the circuit board, the circuit board having a thin thickness may bend easily when the user picks up the circuit board bare-handedly, thereby damaging a solder point on the circuit board.

Taiwan Patent Publication No. 200642543 discloses a process method for a printed circuit board. FIG. 1A illustrates a flow of the method, and FIG. 1B is a schematic side view illustrating the device shown in FIG. 1A. As shown in Steps a and b of FIG. 1A and FIG. 1B, a positioning pillar 72 of a positioning fixture 70 penetrates through a positioning hole 62 of a printed circuit board substrate 60, a positioning hole 42 of a carrying substrate 40, and a positioning hole 82 of a top cover 80, and when a high-temperature soldering process is performed according to Step c in FIG. 1A, bending of the PCB substrate 60 is prevented by the top cover 80 pressing the PCB substrate 60. Although the prior art discloses a technical means to prevent the substrate from bending, the technical means is adapted in the high-temperature soldering process performed to the substrate. After the high-temperature soldering process is performed to the substrate, the user still needs to pick up the substrate bare-handedly, which may easily result in bending of the substrate.

SUMMARY OF THE INVENTION

The disclosure provides a process apparatus capable of pushing a panel-shaped object and a process method thereof, which are capable of prevent the panel-shaped object from bending during a process to pick up the object.

A process apparatus capable of pushing a panel-shaped object according to the disclosure includes a process device and at least one panel-shaped object. The process device includes a carrying fixture and a separating fixture, wherein the carrying fixture has a top surface and a bottom surface opposite to each other and has at least one positioning pillar, and the separating fixture has a pushing portion. The panel-shaped object has at least one positioning hole and is carried on the top surface, wherein the positioning pillar is inserted into the positioning hole to position the panel-shaped object, and the pushing portion is adapted to move from the bottom surface toward the top surface and protrudes out of the top surface, thereby making the panel-shaped object pushed by the pushing portion and separated from the carrying fixture.

According to an embodiment of the disclosure, the panel-shaped object is a circuit board.

According to an embodiment of the disclosure, the panel-shaped object has a thickness less than 1 millimeter.

According to an embodiment of the disclosure, the number of the at least one positioning hole is two, the panel-shaped object has a rectangular surface, and the two positioning holes are respectively adjacent to two vertices of the rectangular surface that are not adjacent.

According to an embodiment of the disclosure, a distance between the positioning hole and an edge of the panel-shaped object is greater than 4 millimeters.

According to an embodiment of the disclosure, the carrying fixture has a plurality of first through-holes penetrating from the top surface to the bottom surface, and the pushing portion includes a plurality of pushing pillars adapted to respectively insert into the first through-holes from the bottom surface and protrudes out of the top surface.

According to an embodiment of the disclosure, a length of each of the pushing pillars is greater than a depth of each of the first through-holes.

According to an embodiment of the disclosure, when the panel-shaped object is carried on the top surface, the plurality of the first through-holes are sequentially arranged along a length direction of the panel-shaped object.

According to an embodiment of the disclosure, the carrying fixture has at least a second through-hole penetrating from the top surface to the bottom surface, the separating fixture has at least one guiding pillar, and when the guiding pillar is inserted into the second through-hole from the bottom surface and protrudes out of the top surface to abut an edge of the panel-shaped object, the pushing portion moves from the bottom surface toward the top surface and protrudes out of the top surface.

According to an embodiment of the disclosure, a length of the guiding pillar is greater than a depth of the second through-hole.

According to an embodiment of the disclosure, an extending direction of the guiding pillar is perpendicular to the top surface.

According to an embodiment of the disclosure, the process apparatus further includes a cover, and when the panel-shaped object is carried on the top surface, the cover fixes the carrying fixture to press the panel-shaped object on the top surface.

According to an embodiment of the disclosure, the cover has at least one first magnetic element, the carrying fixture has at least one second magnetic element, and the cover is fixed to the carrying fixture due to a magnetic attraction force between the first magnetic element and the second magnetic element.

According to an embodiment of the disclosure, the cover has at least one positioning convex portion, the carrying fixture has at least one positioning concave portion, and the cover is positioned to the carrying fixture by inserting the positioning convex portion into the positioning concave portion.

According to an embodiment of the disclosure, the cover has a slot and a plurality of position-limiting convex portions, the slot exposes the panel-shaped object, and the plurality of the position-limiting convex portions extend from an inner edge of the slot and presses the panel-shaped object on the top surface.

According to an embodiment of the disclosure, the carrying fixture has an opening, and when the panel-shaped object is carried on the top surface, a partial section of the panel-shaped object is aligned to the opening.

A process method according to the disclosure is suitable for a process apparatus capable of pushing a panel-shaped object, and includes steps as follows. A carrying fixture, a separating fixture, and a panel-shaped object are provided. In addition, the carrying fixture has a top surface and a bottom surface opposite to each other, the separating fixture has a pushing portion, and the panel-shaped object is carried on the top surface. The pushing portion is driven to move from the bottom surface toward the top surface and protrude out of the upper surface by driving the separating fixture and the carrying fixture to move with respect to each other, thereby making the panel-shaped object pushed by the pushing portion and separated from the separating fixture.

According to an embodiment of the disclosure, the process method further includes steps as follows. A first track, a holding unit, and a storage unit are provided. In addition, the first track is connected to the storage unit. After the panel-shaped object is separated from the carrying fixture, the panel-shaped object is held by using the holding unit and the panel-shaped object is moved to the first track. The panel-shaped object is driven to move along the first track into the storage unit.

According to the embodiment of the disclosure, the method of driving the panel-shaped object to move along the first track includes steps as follows. A first pushing rod is provided. The panel-shaped object is pushed by using the first pushing rod.

According to an embodiment of the disclosure, the process method further includes steps as follows. A second track is provided. After the panel-shaped object is separated from the carrying fixture, the separating fixture is driven to move the carrying fixture located on the separating fixture to the second track. The carrying fixture is driven to move along the second track and away from the separating fixture.

According to an embodiment of the disclosure, the method of driving the carrying fixture to move along the second track includes steps as follows. A second pushing rod is provided. The carrying fixture is pushed by using the second pushing rod.

Based on the above, the pushing portion of the separating fixture according to the embodiments of the disclosure is suitable to move upward from the bottom surface of the carrying fixture and protrude out of the top surface of the carrying fixture, such that the panel-shaped object carried on the top surface is separated from the carrying fixture by pushing of the pushing portion. In this way, the user does not need to bare-handedly separate the panel-shaped object from the carrying fixture, thereby preventing the thin panel-shaped object from bending due to the force applied bare-handedly by the user.

In order to make the aforementioned and other features and advantages of the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1A:
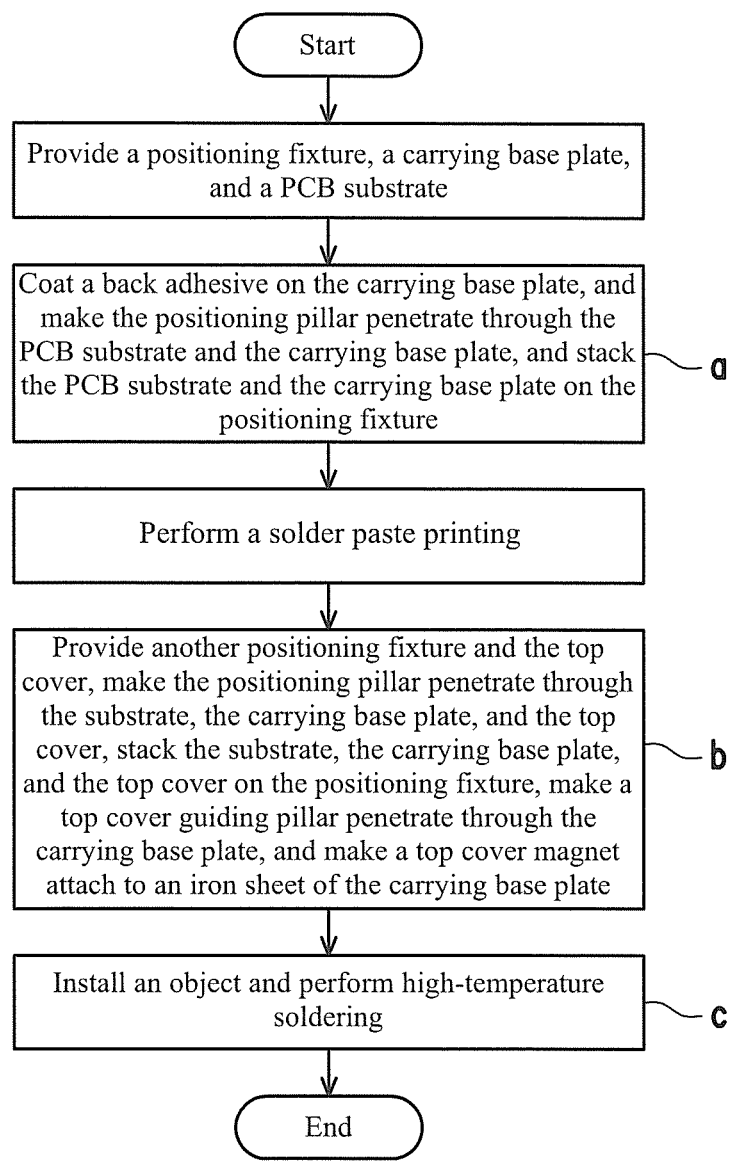
FIG. 1A illustrates a flow of a conventional process method of a printed circuit board.
Figure 1B:
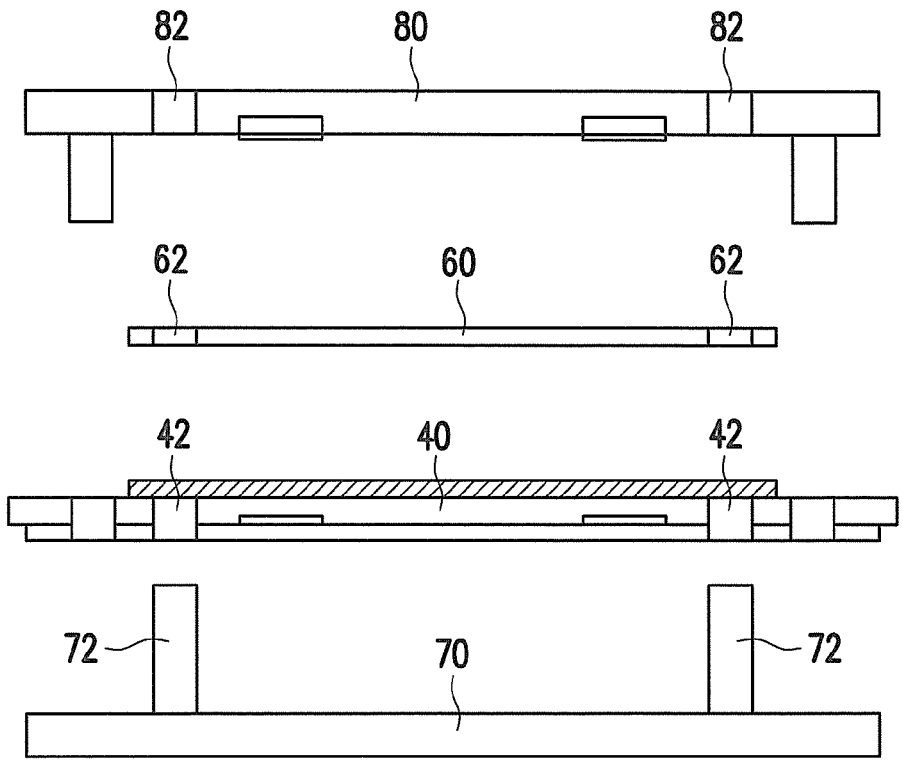
FIG. 1B is a schematic side view illustrating an object shown in FIG. 1A.

Reference will now be made in detail to the present preferred embodiments of the disclosure, examples of which are illustrated in the accompanying drawings. Wherever possible, the same reference numbers are used in the drawings and the description to refer to the same or like parts.

Figure 2:
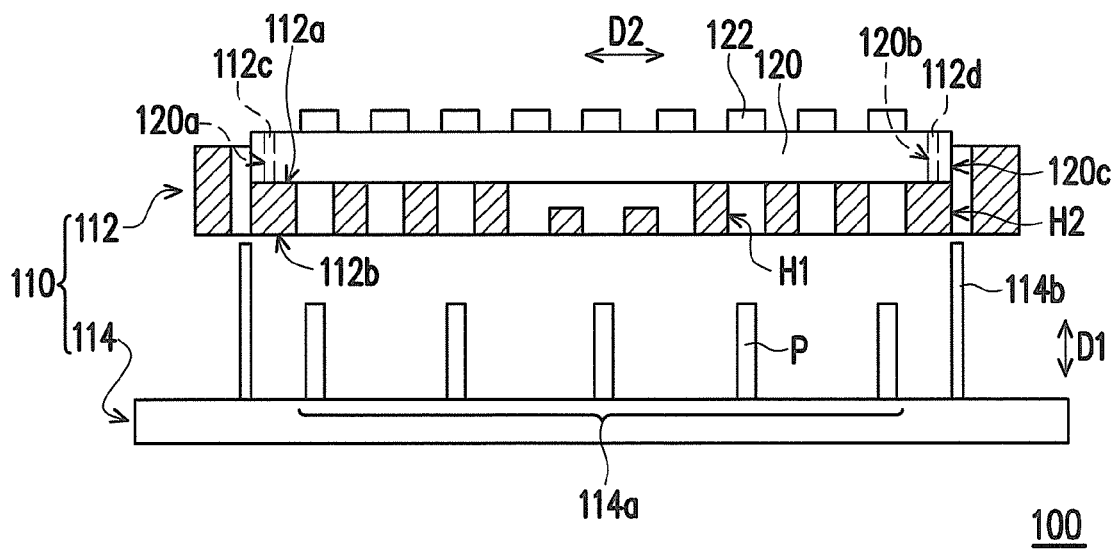
FIG. 2 is a schematic side view of a process apparatus capable of pushing a panel-shaped object according to a first embodiment of the disclosure.
Figure 3:
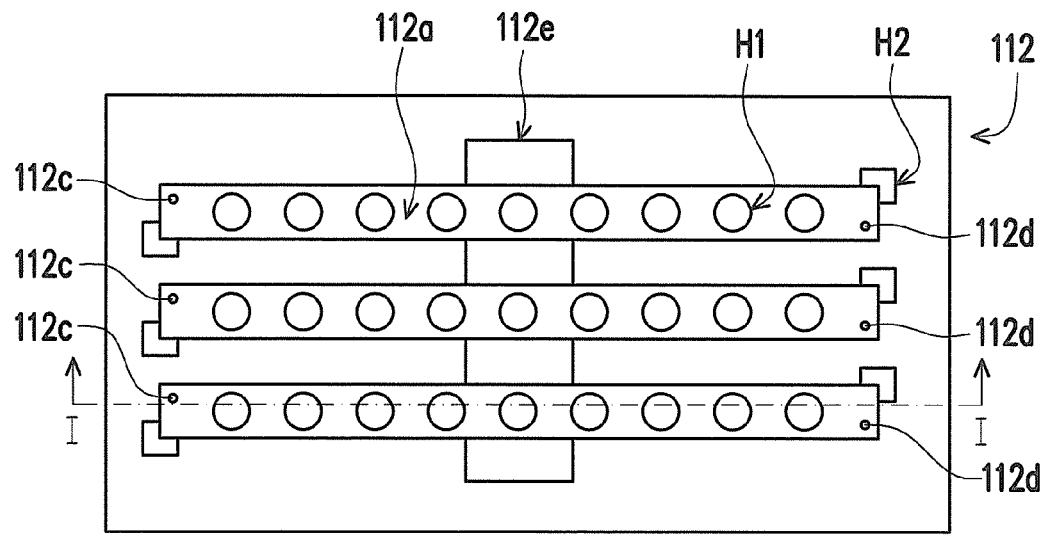
FIG. 3 is a top view illustrating a carrying fixture shown in FIG. 2.
Figure 4:
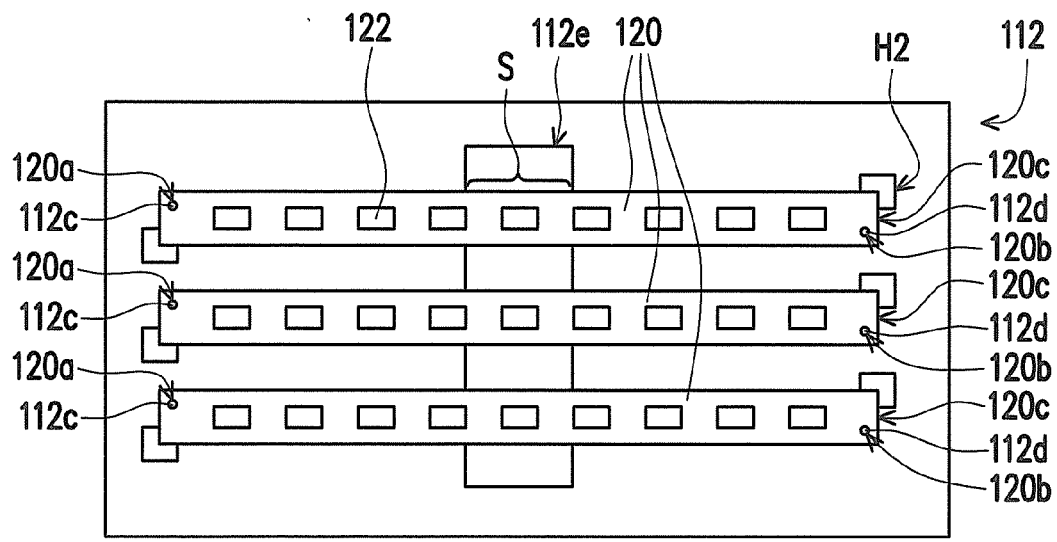
FIG. 4 is a top view illustrating the carrying fixture and a panel-shaped object shown in FIG. 2.
Figure 5:
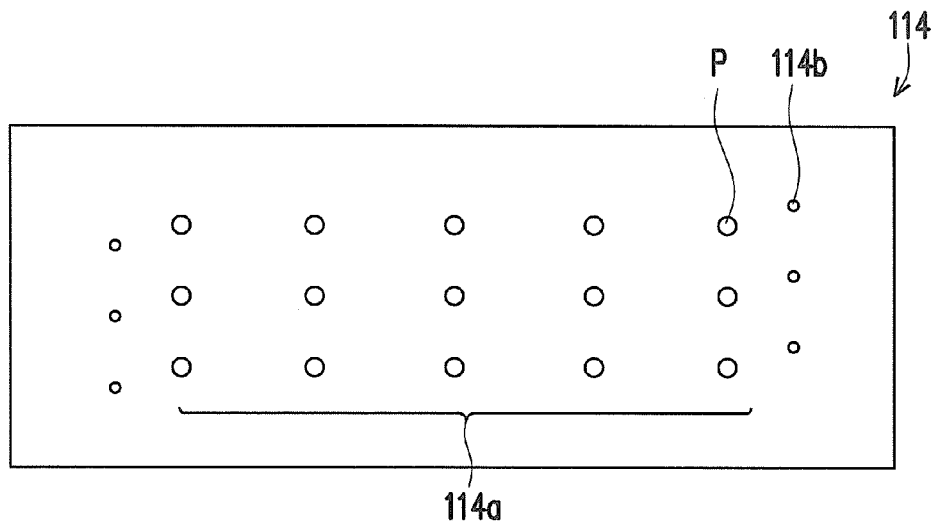
FIG. 5 is a top view illustrating a separating fixture shown in FIG. 2.

FIG. 2 is a schematic side view of a process apparatus capable of pushing a panel-shaped object according to a first embodiment of the disclosure. FIG. 3 is a top view illustrating a carrying fixture shown in FIG. 2. FIG. 4 is a top view illustrating the carrying fixture and a panel-shaped object shown in FIG. 2. FIG. 5 is a top view illustrating a separating fixture shown in FIG. 2. To clearly illustrate with the drawings, a carrying fixture 112 shown in FIG. 2 is drawn along a cross-sectional line I-I of FIG. 3. Referring to FIGS. 2 to 5, a process apparatus 100 capable of pushing a panel-shaped object includes a process device 110 and a plurality of panel-shaped objects 120. The process device 110 includes a carrying fixture 112 and a separating fixture 114.

The carrying fixture 112 has a top surface 112a and a bottom surface 112b opposite to each other, and has a plurality of first through-holes H1, a plurality of second through-holes H2, a plurality of positioning pillars 112c, and a plurality of positioning pillars 112d. The first through-holes H1 and the second through-holes H2 penetrate through the carrying fixture 112 from the top surface 112a of the carrying fixture 112 to the bottom surface 112b of the carrying fixture 112. The separating fixture 114 has a pushing portion 114a and a plurality of guiding pillars 114b, and the pushing portion 114a includes a plurality of pushing pillars P. Each of the panel-shaped objects 120 has two positioning holes 120a and 120b and is suitable to be carried on the top surface 112a of the carrying fixture 112. When the panel-shaped object 120 is carried on the carrying fixture 112, the positioning pillars 112c and 112d of the carrying fixture 112 are respectively inserted into the positioning holes 120a and 120b of the panel-shaped object 120 to position the panel-shaped object 120 and ensure the panel-shaped object 120 is located at a correct position on the carrying fixture 112.

In this embodiment, each of the panel-shaped objects 120 is a circuit board of a light-emitting diode light bar, for example, and a thickness of the panel-shaped object 120 is less than 1 mm, for example. The panel-shaped objects 120 are carried on the carrying fixture 112, and a plurality of light-emitting diodes 122 on the panel-shaped objects 120 are reflow soldered by using the surface mount technology (SMT). Alternatively, the light-emitting diodes 122 may be wave soldered. In other embodiments, the panel-shaped objects 120 may be other kinds of elements disposed on the carrying fixture for other kinds of processes or inspection. The disclosure is not limited thereto.

Figure 6A:
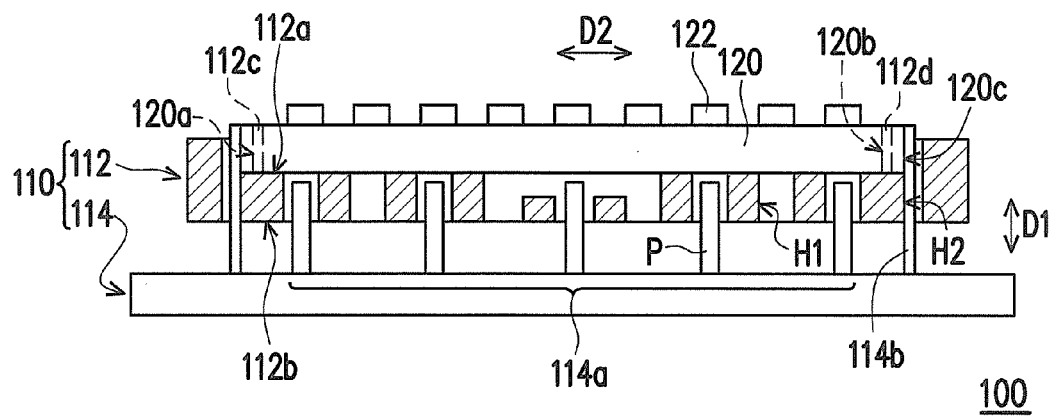
FIGS. 6A and 6B are schematic side views illustrating the carrying fixture and the separating fixture shown in FIG. 2 move with respect to each other.
Figure 6B:
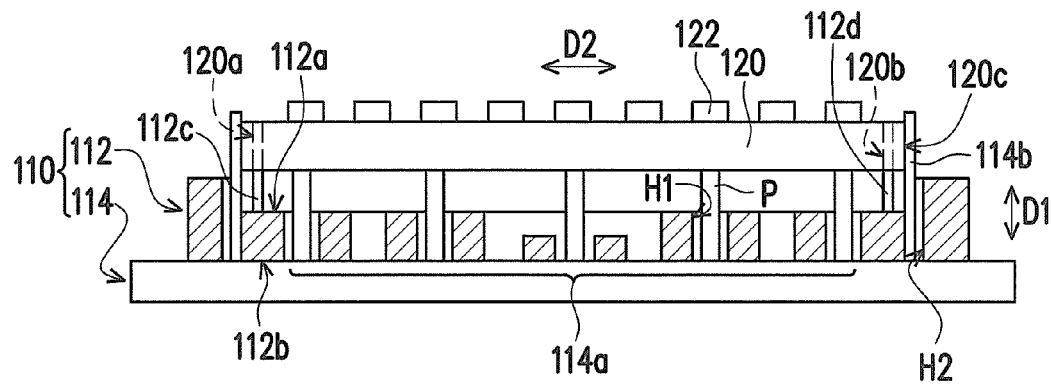

FIGS. 6A and 6B are schematic side views illustrating the carrying fixture and the separating fixture shown in FIG. 2 move with respect to each other. After the soldering process of the light-emitting diodes 122 on the panel-shaped objects 120 is finished, the user may align the carrying fixture 112 to the separating fixture 114, as shown in FIG. 2, and presses down the carrying fixture 112, as shown in FIGS. 6A and 6B. At this time, each of the guiding pillars 114 of the separating fixture 114 is inserted into the corresponding second through-hole H2 from the bottom surface 112b of the carrying fixture 112, protrudes out of the top surface 112a, and abuts an edge 120c of the panel-shaped object 120, as shown in FIGS. 6A and 6B. In addition, the pushing pillars P of the pushing portion 114a of the separating fixture 114 are respectively inserted into the first through-holes H1, move toward the top surface 112a, and protrude out of the top surface 112a, thereby making the panel-shaped objects 112 pushed by the pushing pillars P of the pushing portion 114a and separated from the carrying fixture 112, as shown in FIG. 6B. Accordingly, the user does not need bare-handedly remove the panel-shaped objects 120 from the carrying fixture 112. In this way, the panel-shaped objects 120 having a thin thickness may be prevented from bending due to the force applied by the user bare-handedly, which may damage a solder point of the light-emitting diodes 122.

More specifically, an extending direction D1 (shown in FIG. 2) of the guiding pillars 114b of the separating fixture 114 of this embodiment is perpendicular to the top surface 112a of the carrying fixture 112. In addition, when the panel-shaped objects 120 are carried on the top surface 112a of the carrying fixture 112, the first through-holes H1 of the carrying fixture 112 are sequentially arranged along a length direction D2 (shown in FIG. 2) of the panel-shaped objects 120. Accordingly, during the process that the separating fixture 114 pushes the panel-shaped object 120 away from the carrying fixture 112 as shown in FIGS. 6A to 6B, the panel-shaped object 120 may be limited to be separated from the carrying fixture 112 along a direction perpendicular to the top surface 112a due to the guiding pillars 114b guiding the edge 120c of the panel-shaped object 120, and a force may be uniformly applied to the panel-shaped object 120 by the pushing pillars P protruding out of the first through-holes H1, so as to ensure the panel-shaped object 120 does not bend due to pushing of the pushing portion 114a of the separating fixture 114.

In this embodiment, a length of each of the pushing pillars P along the direction D1 is greater than a depth of each of the first through-holes H1 along the direction D1, such that the pushing pillar P is allowed to penetrate through the first through-hole H1 to protrude out of the first surface 112a. Similarly, a length of each of the guiding pillars 114b along the direction D1 is greater than a depth of each of the second through-holes H2 along the direction D1, such that the guiding pillar 114b is allowed to penetrate through the second through-hole H2 to protrude out of the first surface 112a. Specifically, the lengths of the pushing pillar P and the guiding pillar 114b of this embodiment along the direction D1 are longer than 20 mm, for example. However, the disclosure is not limited thereto. In other embodiments, the lengths of the pushing pillar P and the guiding pillar 114b may be modified based on the needs in design.

Figure 7:
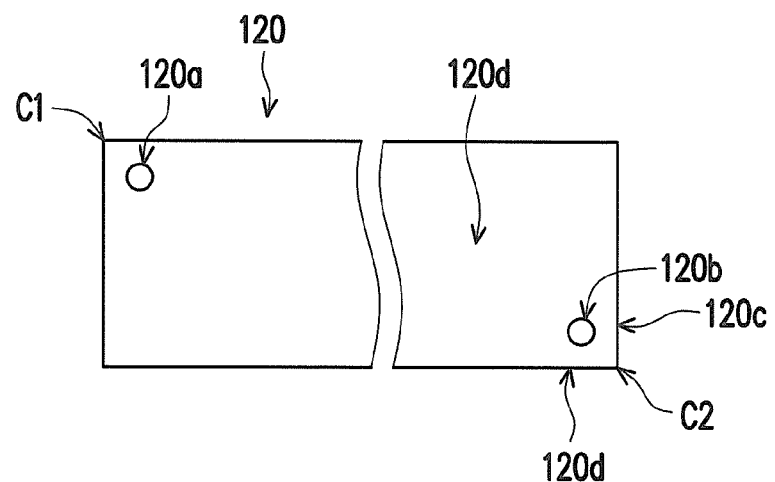
FIG. 7 is an enlarged view of the panel-shaped object shown in FIG. 4.

FIG. 7 is an enlarged view of the panel-shaped object shown in FIG. 4. Referring to FIG. 7, the panel-shaped object 120 of this embodiment has a rectangular surface 120d, and the two positioning holes 120a and 120b are respectively adjacent to two vertices C1 and C2 of the rectangular surface 120d that are not adjacent to each other and arranged opposite to each other diagonally, thereby preventing the user from placing the plate-shaped object 120 on the carrying fixture 112 in an incorrect direction. In other embodiments, there may be other suitable numbers of position holes on the panel-shaped object, and the positioning holes may be arranged in a suitable and asymmetrical configuration, so as to prevent the user from placing the plate-shaped object 120 in an incorrect way. The disclosure is not limited thereto.

In this embodiment, a distance between the positioning holes 120a and 120b and an edge of the panel-shaped object 120 is designed to be greater than a determined value, such that a structural strength of the panel-shaped object 120 is not reduced by formation of the positioning holes 120a and 120b. For example, a distance between the positioning hole 120b and the edge 120c of the panel-shaped object 120 and a distance between the positioning hole 120b and an edge 120d of the panel-shaped object 120 are both greater than 4 mm, for example. However, the disclosure is not limited thereto. In other embodiments, other suitable distances between the positioning hole and the edge of the panel-shaped object 120 may be designed based on the needs in design.

Referring to FIGS. 3 and 4, the carrying fixture 112 of this embodiment has an opening 112e. When the panel-shaped object 120 is carried on the top surface 112a (shown in FIG. 3) of the carrying fixture 112, as shown in FIG. 4, a partial section S of the panel-shaped object 120 is aligned with the opening 112e of the carrying fixture 112, such that the user may pick up the panel-shaped object 120 bare-handedly through the opening 112e under a special circumstance (e.g. when the carrying fixture 112 and the separating fixture 114 do not operate normally).

Figure 8:
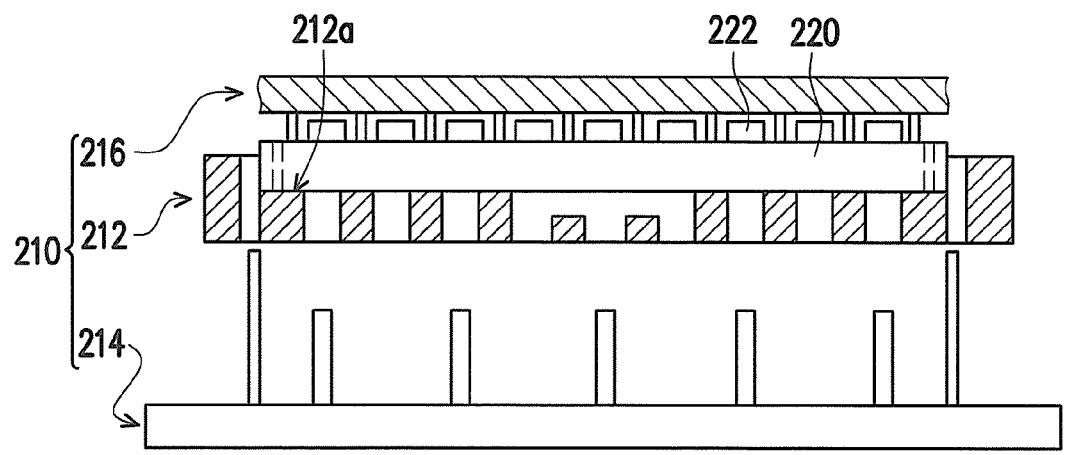
FIG. 8 is a schematic side view of a process apparatus capable of pushing a panel-shaped object according to a second embodiment of the disclosure.
Figure 9:
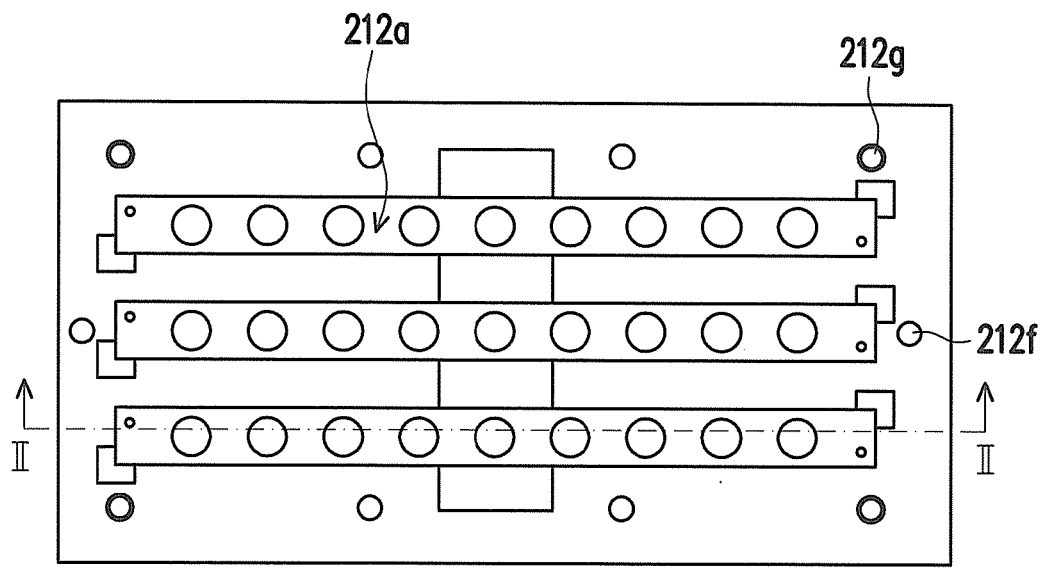
FIG. 9 is a top view illustrating a carrying fixture shown in FIG. 8.
Figure 10:
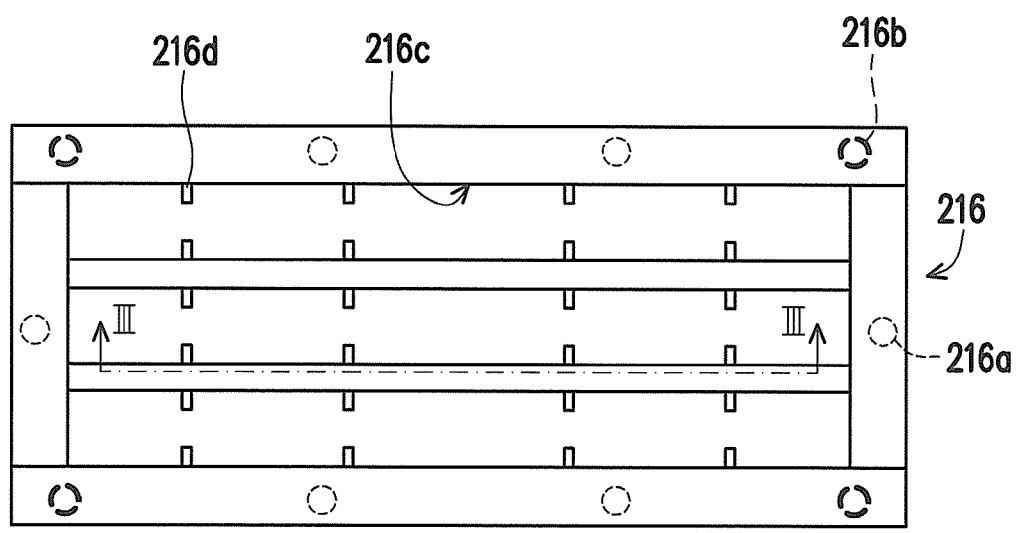
FIG. 10 is a top view illustrating a cover shown in FIG. 8.
Figure 11:
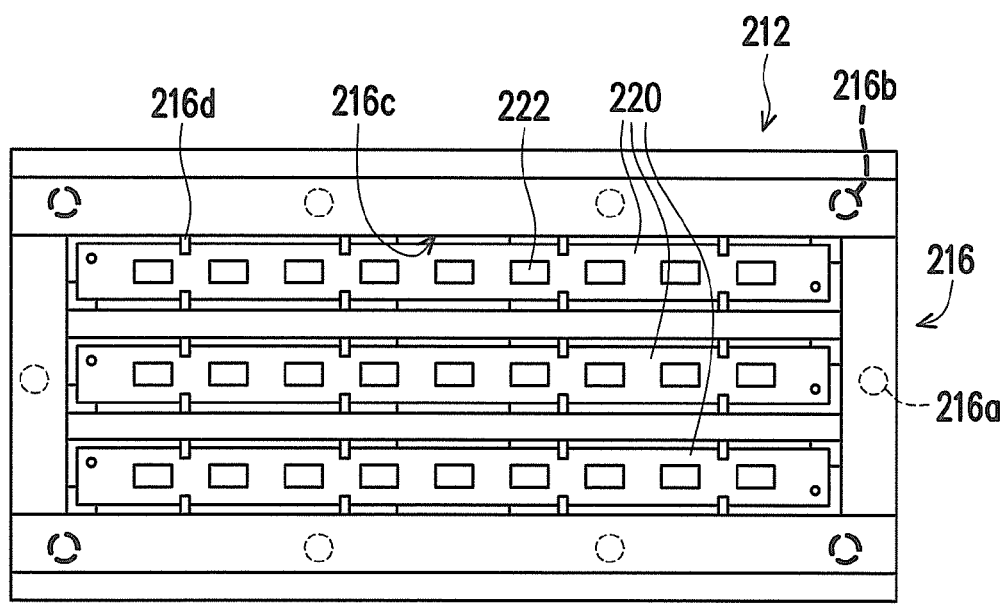
FIG. 11 is a top view illustrating the cover, the carrying fixture, and the panel-shaped object shown in FIG. 8.

FIG. 8 is a schematic side view of a process apparatus capable of pushing a panel-shaped object according to a second embodiment of the disclosure. FIG. 9 is a top view illustrating a carrying fixture shown in FIG. 8. FIG. 10 is a top view illustrating a cover shown in FIG. 8. FIG. 11 is a top view illustrating the cover, the carrying fixture, and the panel-shaped object shown in FIG. 8. To clearly illustrate with the drawings, a carrying fixture 212 shown in FIG. 8 is drawn along a cross-sectional line II-II of FIG. 9, and a cover 216 shown in FIG. 8 is drawn along a cross-sectional line III-III of FIG. 10. Referring to FIGS. 8 to 11, in a process apparatus 210 capable of pushing a panel-shaped object in this embodiment, the carrying fixture 212, a separating fixture 214, and a panel-shaped object 220 are disposed and function in a way similar to the carrying fixture 112, the separating fixture 114, and the panel-shaped object 120 of the process apparatus 100 capable of pushing the panel-shaped object of the first embodiment. Therefore, details in this respect will not be reiterated below. The process apparatus 210 capable of pushing the panel-shaped object of the second embodiment differs from the process apparatus 100 capable of pushing the panel-shaped object of the first embodiment in that the process apparatus 210 further includes a cover 216. When the panel-shaped object 220 is carried on a top surface 212a of the carrying fixture 212, the cover 216 may be fixed to the carrying fixture 212 to press the panel-shaped object 220 to the top surface 212a of the carrying fixture 212, so as to prevent the panel-shaped object 220 on the carrying fixture 212 from bending as the temperature in a soldering process changes.

Specifically, the cover 216 of this embodiment has a plurality of first magnetic elements 216a, and the carrying fixture 212 has a plurality of second magnetic elements 212f. When the user places the cover 216 on the carrying fixture 212, the first magnetic elements 216a are respectively aligned to the second magnetic elements 212f. In this way, the cover 216 is fixed to the carrying fixture 212 due to a magnetic attraction force between the first magnetic elements 216a and the second magnetic elements 212f. In addition, the cover 216 of this embodiment further includes a plurality of positioning convex portions 216b, and the carrying fixture 212 of this embodiment further includes a plurality of positioning concave portions 212g. The cover 216 is positioned to the carrying fixture 212 by respectively inserting the positioning convex portions 216b into the positioning concave portions 212g. In other embodiments, the cover 216 may be fixed to the carrying fixture 212 in other suitable ways. The disclosure is not limited thereto.

In addition, the cover 216 of this embodiment further includes a plurality of slots 216c and a plurality of position-limiting convex portions 216d. The slots 216c are used to expose the panel-shaped objects 220 to allow light-emitting diodes 222 on the panel-shaped objects 220 to be soldered properly. The position-limiting portions 216d extend from inner edges of the slots 216c and press the panel-shaped objects 220 on the top surface 212a (shown in FIG. 9) of the carrying fixture 212.

Figure 12A:
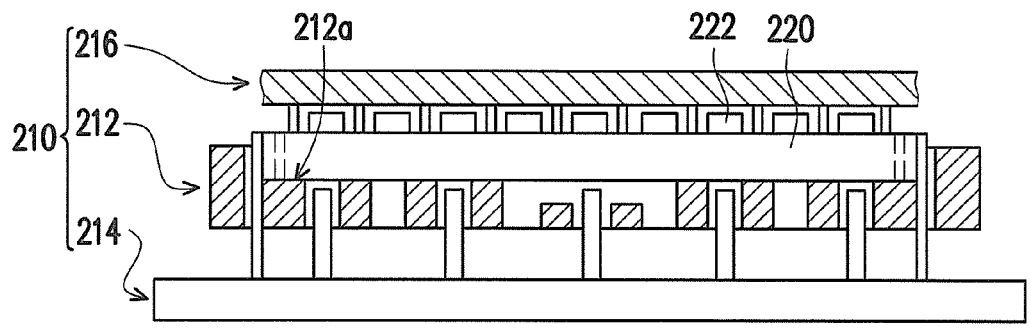
FIGS. 12A and 12B are schematic side views illustrating the carrying fixture and the separating fixture shown in FIG. 8 move with respect to each other.
Figure 12B:
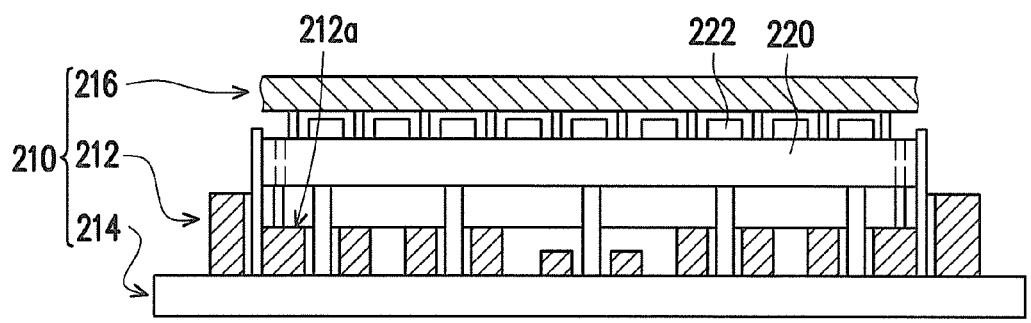

FIGS. 12A and 12B are schematic side views illustrating the carrying fixture and the separating fixture shown in FIG. 8 move with respect to each other. After a soldering process of the light-emitting diodes 222 on the panel-shaped objects 220 is finished, the user may align the carrying fixture 212 to the separating fixture 214, as shown in FIG. 8, and presses down the carrying fixture 212, as shown in FIGS. 12A and 12B, such that the panel-shaped objects 220 are separated from the carrying fixture 212 when pushed by the separating fixture 214, as shown in FIG. 12B. The separating fixture 214 pushes the panel-shaped objects 220 in a way similar to the way the separating fixture 114 pushes the panel-shaped objects 120 of the first embodiment. Therefore, details in this respect will not be reiterated below. An operational flow of the second embodiment shown in FIGS. 12A to 12B differs from the operational flow of the first embodiment shown in FIGS. 6A and 6B in that the cover 216 is separated from the carrying fixture 212 when the panel-shaped objects 220 moves upward, as shown in FIG. 12B. At this time, the cover 216 may be removed from the panel-shaped objects 220, and then the panel-shaped objects 220 may be picked up from the separating fixture 214.

Figure 13:
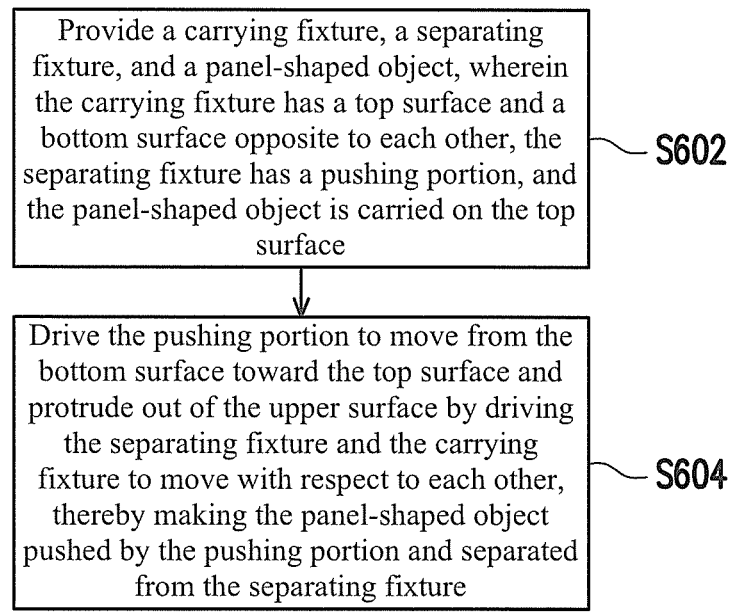
FIG. 13 is a flowchart illustrating a process method corresponding to the process apparatus capable of pushing the panel-shaped object shown in FIG. 2.

In the following, the process apparatus 100 capable of pushing the panel-shaped object of the first embodiment is used as an example to describe a process method of the disclosure. FIG. 13 is a flowchart illustrating a process method corresponding to the process apparatus capable of pushing the panel-shaped object shown in FIG. 2. Referring to FIGS. 2 and 13, first of all, the carrying fixture 112, the separating fixture 114, and the panel-shaped object 120 are provided, wherein the carrying fixture 112 has the top surface 112a and the bottom surface 112b opposite to each other, the separating fixture 114 has the pushing portion 114a, and the panel-shaped object 120 is carried on the top surface 112a (Step S602). Referring to FIGS. 6A and 6B, and FIG. 13, then, the pushing portion 114a is driven to move from the bottom surface 112b toward the top surface 112a and protrude out of the top surface 112a by driving the separating fixture 114 and the carrying fixture 112 to move with respect to each other, thereby making the panel-shaped object 120 pushed by the pushing portion 114a and separated from the carrying fixture (Step S604).

Figure 14A:
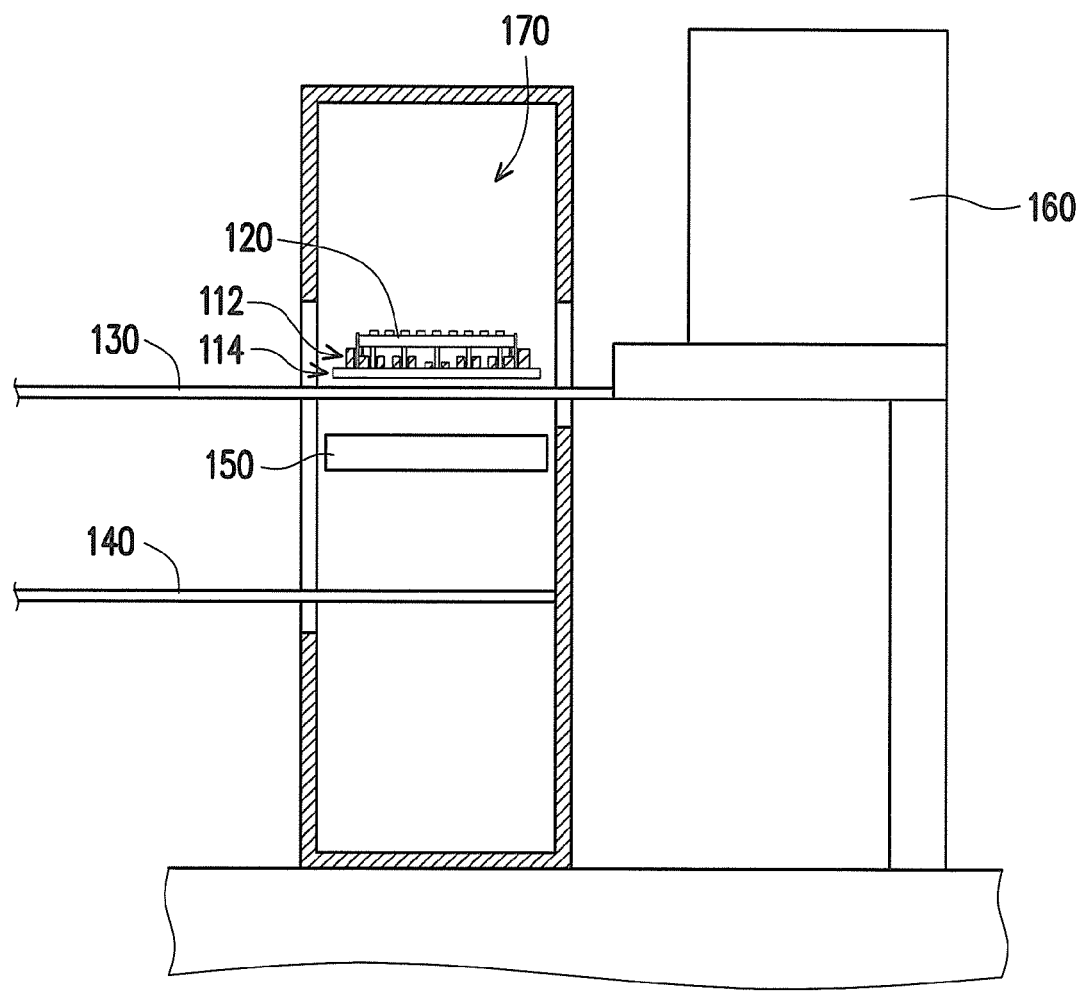
FIGS. 14A to 14C are schematic views illustrating the process apparatus capable of pushing the panel-shaped object shown in FIG. 2 operate in a production line.
Figure 14B:
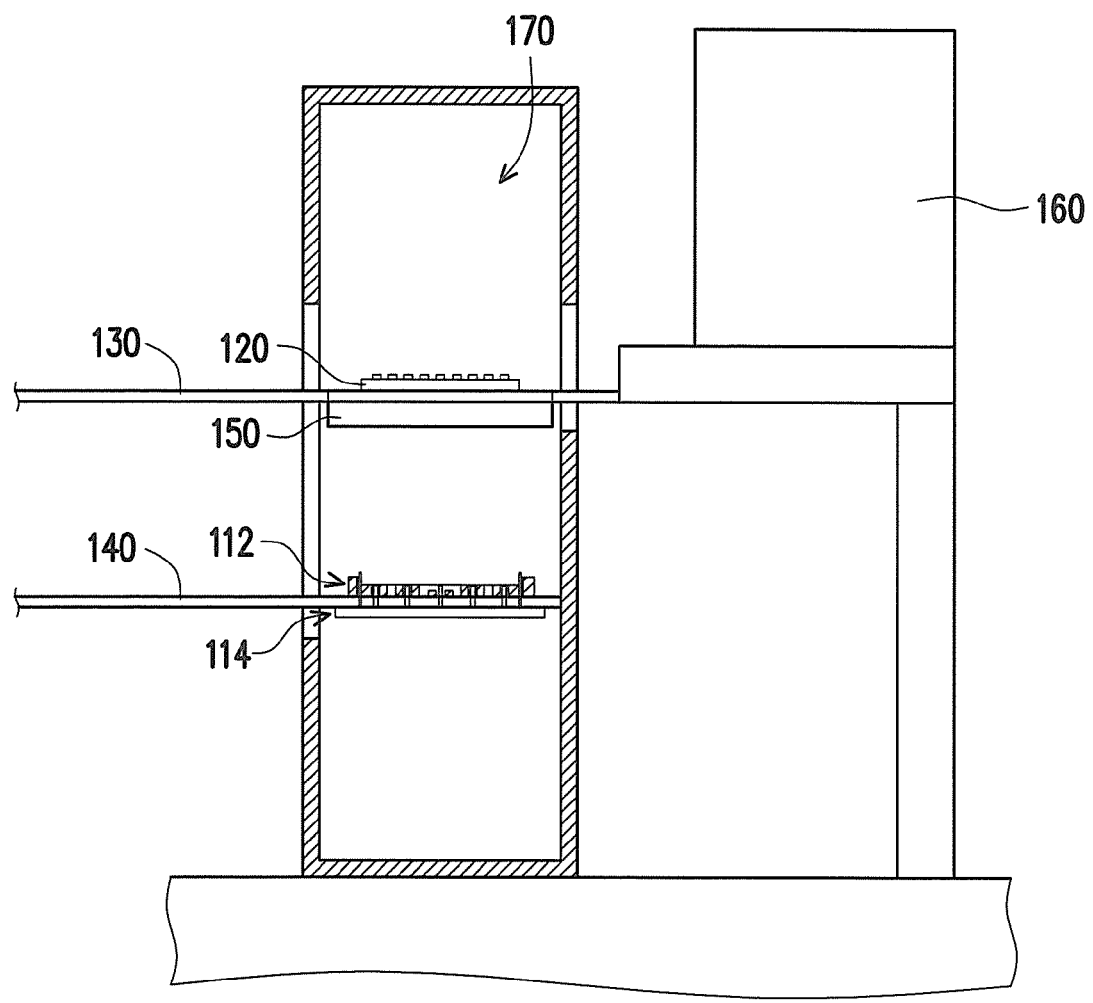
Figure 14C:
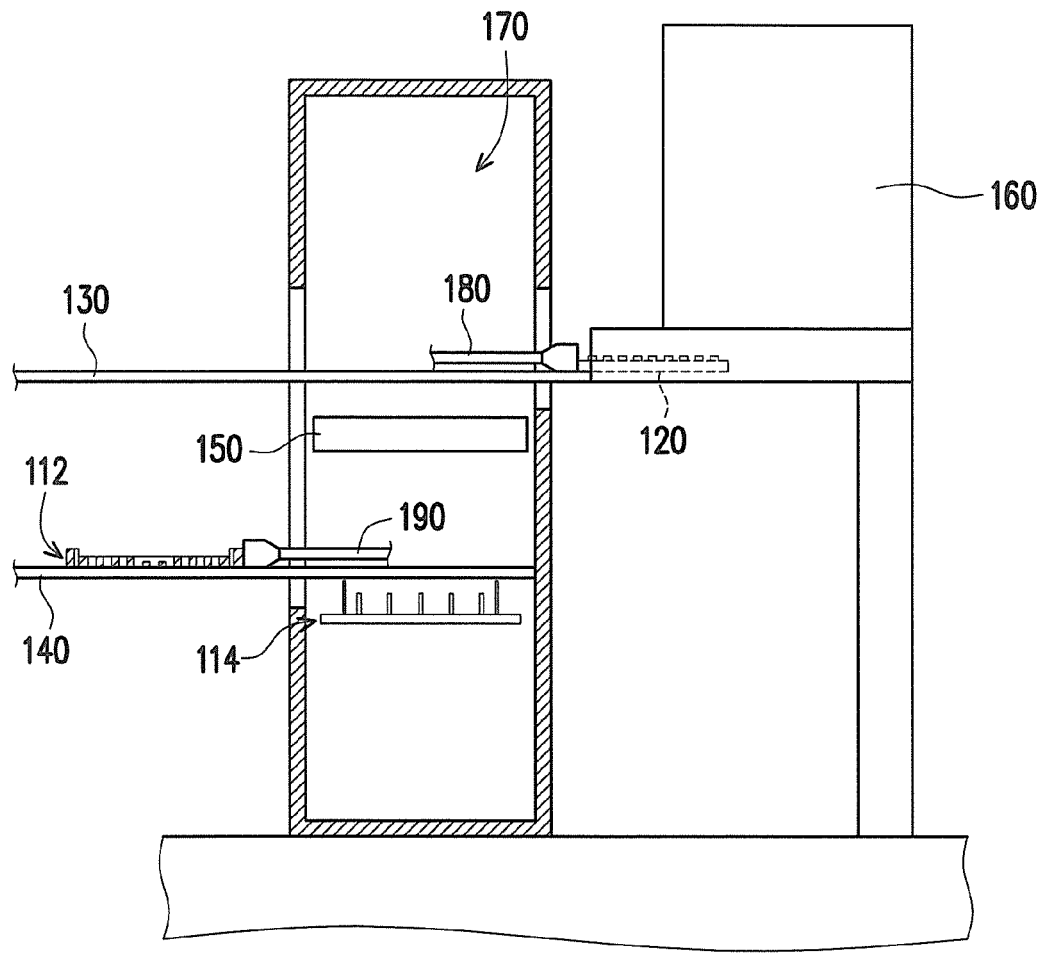

FIGS. 14A to 14C are schematic views illustrating the process apparatus capable of pushing the panel-shaped object shown in FIG. 2 operate in a production line. Referring to FIGS. 14A to 14C, the process method further includes steps as follows. A first track 130, a second track 140, a holding unit 150, a storage unit 160, and a work space 170 are provided, wherein the first track 130 is connected to the storage unit 160, the second track 140 is located below the first track 130, the holding unit 150 and the separating fixture 114 are movably disposed in the work space 170.

After the panel-shaped object 120 is separated from the carrying fixture 112, as shown in Step S602 of FIG. 13 and FIGS. 6B and 14A, the holding unit 150 holds and moves the panel-shaped object 120 to the first track 130, as shown in FIG. 14B, and drives the separating fixture 114 to move the carrying fixture 112 located on the separating fixture 120 to the second track 140. Then, as shown in FIG. 14C, after the panel-shaped object 120 is placed on the first track 130, the panel-shaped object 120 is pushed by using a first pushing rod 180, thereby driving the panel-shaped object 120 to move along the first track 130 into the storage unit 160. In addition, as shown in FIG. 14C, after the carrying fixture 112 is placed on the second track 140, the carrying fixture 112 is pushed by using a second pushing rod 190, thereby driving the carrying fixture 112 to move along the second track 140 and away from the separating fixture 114, such that the carrying fixture 112 is available for carrying another panel-shaped object to perform soldering process on it.

In this embodiment, the holding unit 150 may hold and move the panel-shaped object 120 to the first track 130 by a suitable structure and a suitable way of movement thereof. The disclosure does not intend to limit the configuration and operation of the holding unit 150. Moreover, after the separating fixture 114 moves the carrying fixture 112 to the second track 140, the carrying fixture 112 may be moved from the separating fixture 114 to the second track 140 manually or by using an automation equipment. The disclosure is not limited thereto. In addition, the disclosure does not intend to limit the way the separating fixture 114 and the holding unit 150 move. The separating fixture 114 and the holding unit 150 may move relatively in a suitable way to prevent from interfering or blocking each other in the work space 170.

In view of the foregoing, the pushing portion of the separating fixture according to the embodiments of the disclosure is suitable to move upward from the bottom surface of the carrying fixture and protrude out of the top surface of the carrying fixture, such that the panel-shaped object carried on the top surface is separated from the carrying fixture by pushing of the pushing portion. In this way, the user does not need to bare-handedly separate the panel-shaped object from the carrying fixture, thereby preventing the thin panel-shaped object from bending due to the force applied bare-handedly by the user. In addition, the extending direction of the guiding pillars of the separating fixture is perpendicular to the top surface of the carrying fixture, and when the panel-shaped object is carried on the carrying fixture on the top surface, the plurality of first through-holes of the carrying fixture are sequentially arranged along the length direction of the panel-shaped object. In this way, during the process that the separating fixture pushes the panel-shaped object away from the separating fixture by using the plurality of pushing pillars of the pushing portion, the panel-shaped object may be limited to be separated from the carrying fixture in the direction perpendicular to the top surface of the carrying fixture due to the guiding pillars guides the edge of the panel-shaped object, and a force may be uniformly applied to the panel-shaped object by the pushing pillars protruding out of the first through-holes, so as to ensure the panel-shaped object does not bend due to pushing of the pushing portion of the separating fixture.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A process apparatus capable of pushing a panel-shaped object, comprising:
a process device, comprising a carrying fixture and a separating fixture, wherein the carrying fixture has a top surface and a bottom surface opposite to each other and has at least one positioning pillar, and the separating fixture has a pushing portion; and
at least one panel-shaped object, having at least one positioning hole and carried on the top surface, wherein the positioning pillar is inserted into the positioning hole to position the panel-shaped object, and the pushing portion is adapted to move from the bottom surface toward the top surface and protrudes out of the top surface, thereby making the panel-shaped object pushed by the pushing portion and separated from the carrying fixture,
wherein the panel-shaped object is a circuit board.

2. The process apparatus capable of pushing the panel-shaped object as claimed in claim 1, wherein the panel-shaped object has a thickness less than 1 millimeter.

3. The process apparatus capable of pushing the panel-shaped object as claimed in claim 1, wherein the number of the at least one positioning hole is two, the panel-shaped object has a rectangular surface, and the two positioning holes are respectively adjacent to two vertices of the rectangular surface that are not adjacent.

4. The process apparatus capable of pushing the panel-shaped object as claimed in claim 1, wherein a distance between the positioning hole and an edge of the panel-shaped object is greater than 4 millimeters.

5. The process apparatus capable of pushing the panel-shaped object as claimed in claim 1, wherein the carrying fixture has a plurality of first through-holes penetrating from the top surface to the bottom surface, and the pushing portion comprises a plurality of pushing pillars adapted to respectively insert into the first through-holes from the bottom surface and protrudes out of the top surface.

6. The process apparatus capable of pushing the panel-shaped object as claimed in claim 5, wherein a length of each of the pushing pillars is greater than a depth of each of the first through-holes.

7. The process apparatus capable of pushing the panel-shaped object as claimed in claim 5, wherein when the panel-shaped object is carried on the top surface, the plurality of the first through-holes are sequentially arranged along a length direction of the panel-shaped object.

8. The process apparatus capable of pushing the panel-shaped object as claimed in claim 1, wherein the carrying fixture has at least a second through-hole penetrating from the top surface to the bottom surface, the separating fixture has at least one guiding pillar, and when the guiding pillar is inserted into the second through-hole from the bottom surface and protrudes out of the top surface to abut an edge of the panel-shaped object, the pushing portion moves from the bottom surface toward the top surface and protrudes out of the top surface.

9. The process apparatus capable of pushing the panel-shaped object as claimed in claim 8, wherein a length of the guiding pillar is greater than a depth of the second through-hole.

10. The process apparatus capable of pushing the panel-shaped object as claimed in claim 8, wherein an extending direction of the guiding pillar is perpendicular to the top surface.

11. The process apparatus capable of pushing the panel-shaped object as claimed in claim 1, wherein the process apparatus further comprises a cover, and when the panel-shaped object is carried on the top surface, the cover fixes the carrying fixture to press the panel-shaped object on the top surface.

12. The process apparatus capable of pushing the panel-shaped object as claimed in claim 11, wherein the cover has at least one first magnetic element, the carrying fixture has at least one second magnetic element, and the cover is fixed to the carrying fixture due to a magnetic attraction force between the first magnetic element and the second magnetic element.

13. The process apparatus capable of pushing the panel-shaped object as claimed in claim 11, wherein the cover has at least one positioning convex portion, the carrying fixture has at least one positioning concave portion, and the cover is positioned to the carrying fixture by inserting the positioning convex portion into the positioning concave portion.

14. The process apparatus capable of pushing the panel-shaped object as claimed in claim 11, wherein the cover has a slot and a plurality of position-limiting convex portions, the slot exposes the panel-shaped object, and the plurality of the position-limiting convex portions extend from an inner edge of the slot and presses the panel-shaped object on the top surface.

15. The process apparatus capable of pushing the panel-shaped object as claimed in claim 1, wherein the carrying fixture has an opening, and when the panel-shaped object is carried on the top surface, a partial section of the panel-shaped object is aligned to the opening.

\* \* \* \* \*